United States Patent
Head

[11] Patent Number: 5,299,237
[45] Date of Patent: Mar. 29, 1994

[54] ASYMMETRICAL DATA TRACKING DIGITAL PHASE LOCKED LOOP

[75] Inventor: Glenn M. Head, Dunedin, Fla.

[73] Assignee: Honeywell Inc., Minneapolis, Minn.

[21] Appl. No.: 810,821

[22] Filed: Dec. 20, 1991

[51] Int. Cl.$^5$ .............................................. H03D 3/24
[52] U.S. Cl. .................... 375/120; 331/1 R; 328/63
[58] Field of Search ................ 375/119, 120, 95, 106; 331/1 R, 11, 25; 328/63, 155, 179

[56] References Cited

U.S. PATENT DOCUMENTS

| | | | |
|---|---|---|---|
| 3,611,298 | 10/1971 | Jacobson | 375/95 |
| 3,851,257 | 11/1974 | Boersma | 328/179 |
| 4,855,683 | 8/1989 | Troudet et al. | 331/25 |

Primary Examiner—Curtis Kuntz
Assistant Examiner—Don N. Vo
Attorney, Agent, or Firm—John T. Winburn; Albin Medved

[57] ABSTRACT

An improved asymmetrical data tracking digital phase locked loop including separate baud rate counters for both the positive data pulse edge and the negative data pulse edge. The outputs of the two independent baud rate counters are added together and divided by two in a virtual counter for each local oscillator clock cycle. This provides a data clock pulse located at the midpoint between the corresponding data pulse edges as defined by the two baud rate counters. A digital filter is utilized to dampen the tracking loop correction to reduce maximum phase errors by not allowing continuous phase corrections.

16 Claims, 2 Drawing Sheets

Asymmetrical Data Tracking Digital Phase Locked Loop

ASYMMETRICAL DATA TRACKING DIGITAL PHASE LOCKED LOOP

FIELD OF THE INVENTION

The present invention relates generally to digital phase locked loops, and more particularly is directed to improved asymmetrical data tracking for digital phase locked loops.

BACKGROUND OF THE INVENTION

Digital phase locked loops conventionally are utilized to capture and lock in on incoming data signals. The digital phase locked loops generally attempt to generate a data clock which has a data pulse sampling edge which occurs at a midpoint between the two data edges which bound a data bit. By selecting the midpoint of the data bit, a maximum sampling timing margin is provided.

The digital phase locked loop typically generates the data clock sampling edge a fixed number of local oscillator clock pulses following a sensed data pulse transition edge. This is based upon a predetermined presumption of the data pulse width. If sampling asymmetrical data (data one's and data zero's having different widths), the timing margin to the data pulse edge following the sampling clock pulse edge is reduced as the data bit width becomes more narrow. If the asymmetrical data pulse bit width narrows to less than fifty (50) percent of the expected or presumed pulse width, then the data pulse cannot be correctly recovered by the fixed data pulse clock.

It would be desirable to provide a digital phase locked loop which can recover a wide range of data pulse widths without undue loss of stability.

SUMMARY OF THE INVENTION

The present invention is directed to an improved asymmetrical data tracking digital phase locked loop. The digital phase locked loop includes separate baud rate counters for both the positive data pulse edge and the negative data pulse edge. The outputs of the two independent baud rate counters are added together and divided by two in a virtual counter for each local oscillator clock cycle. This provides a data clock pulse located at the midpoint between the corresponding data pulse edges as defined by the two baud rate counters. A digital filter is utilized to dampen the tracking loop correction to reduce maximum phase errors by not allowing continuous phase corrections.

These and other features and advantages of the invention will be more readily apparent upon reading the following description of a preferred exemplified embodiment of the invention and upon reference to the accompanying drawings wherein:

While the invention will be described and disclosed in connection with certain preferred embodiments and procedures, it is not intended to limit the invention to those specific embodiments. Rather it is intended to cover all such alternative embodiments and modifications as fall within the spirit and scope of the invention.

DESCRIPTION OF THE PREFERRED EMBODIMENT

Figure 1:
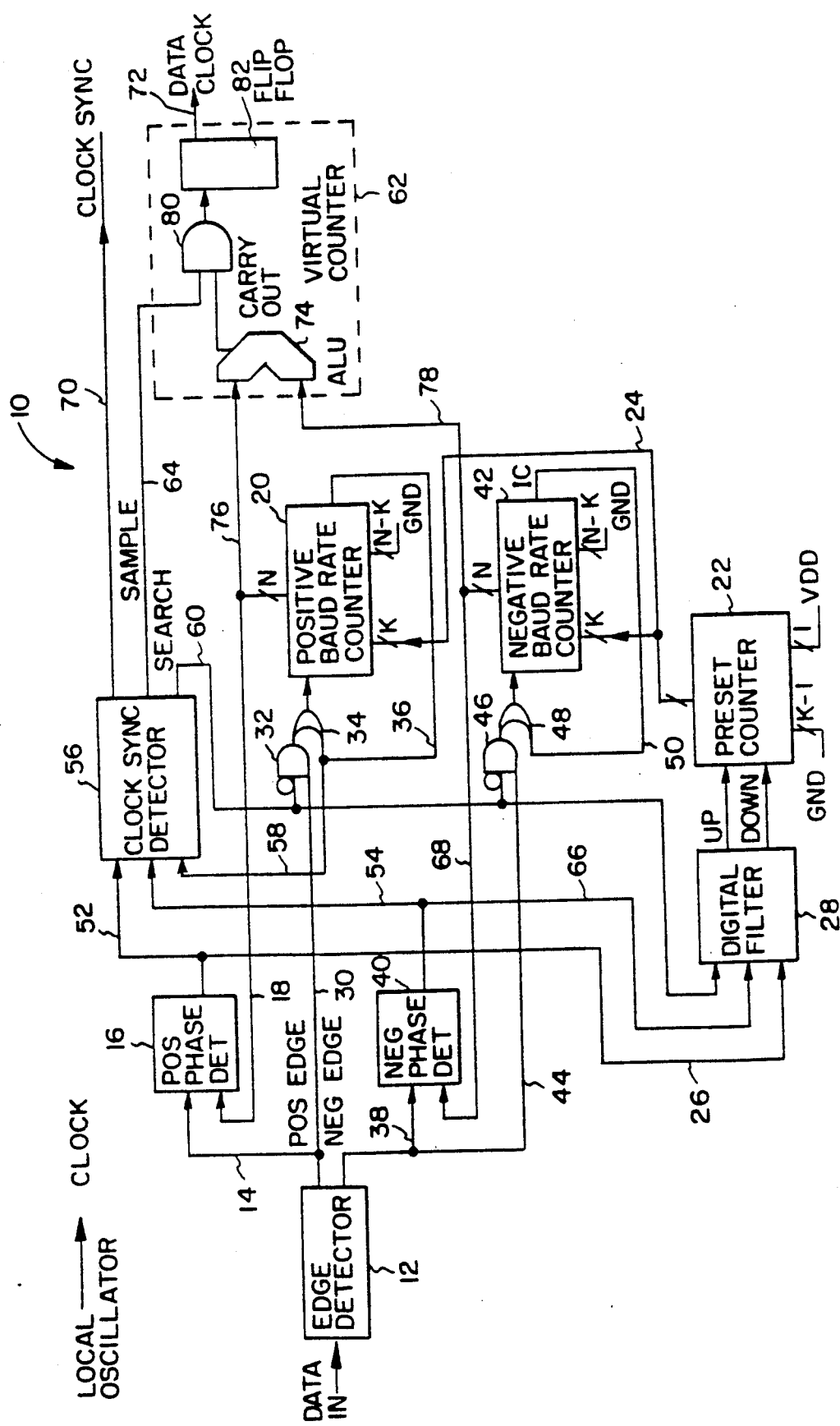
FIG. 1 is a schematic diagram of one embodiment of the asymmetrical data tracking digital phase locked loop of the present invention.

Referring now to FIG. 1, a preferred embodiment of the asymmetrical data tracking digital phase locked loop of the present invention is designated generally by the reference character 10. The asymmetrical data tracking digital phase locked loop 10 (for convenience hereinafter digital phase locked loop) includes an edge detector 12. The data pulses are input (DATA IN) to the edge detector 12, which produces for each data pulse a positive edge signal (POS EDGE) and a negative edge signal (NEG EDGE).

To initially lock in the incoming data pulse stream, the digital phase locked loop 10 only makes corrections with respect to the POS EDGE signal. The POS EDGE signal is fed via a line 14 to a positive phase detector 16. The positive phase detector 16 includes a second input on a line 18 from a positive baud rate counter 20. The baud rate counter 20 is loaded with the output of a preset counter 22 via a line 24. The preset counter 22 is loaded for a predetermined data baud rate or frequency.

If the incoming POS EDGE signal occurs at the positive phase detector 16 early with respect to the input from the baud rate counter 20, then an increment counter signal is fed from the positive phase detector 16 to the preset counter 22 via a line 26. The increment counter signal (UP) is fed through a digital filter 28. The digital filter 28 provides a dampening to the update loop.

The digital filter 28 prevents the preset counter 22 from being updated by consecutive corrections in the same direction for a selected time period, such is in the form of a Delta slope algorithm. When the direction of the update correction changes, the first update will be allowed without regard to the time period. The digital filter 28 reduces the peak swings in the phase error following a string of data one's or zero's.

If the POS EDGE signal occurs late at the positive phase detector 16 with respect to the input from the baud rate counter 20, then a decrement counter signal (DOWN) is fed to the preset counter 22 via the line 26 and the filter 28. The preset counter 22 is not updated if the POS EDGE signal occurs with zero phase error.

During this initial synchronization stage, the baud rate counter 20 is loaded with the contents of the preset counter 22 on the occurrence of each POS EDGE signal via a line 30, an AND gate 32 and an OR gate 34. The contents of the preset counter 22 are also loaded into the baud rate counter 20 by a terminal count output (TC) via a line 36, when the baud rate counter 20 counts out before receiving a POS EDGE signal.

In a like manner, a NEG EDGE signal is coupled from the edge detector 12 via a line 38 to a negative phase detector 40. During the increment counter signal, the output of the negative phase detector 40 is not utilized, because it is desired not to search for both data pulse edges. Either the POS EDGE signal or NEG EDGE signal could be selected for the increment counter signal.

The NEG EDGE signal also is fed to a NEG EDGE signal baud rate counter 42 via a line 44, an AND gate 45 and an OR gate 48. The NEG EDGE signal loads the contents of the preset counter 22 also into the negative baud rate counter 42 each time it occurs. Also, like the baud rate counter 20, the negative baud rate counter 42 is loaded with the contents of the preset counter 22 by a terminal count (TC) via a line 50, when the baud rate counter 42 counts out before receiving a NEG EDGE signal.

The next stage or state of the digital phase locked loop 10 is the search stage. This stage is obtained by a preset consecutive number of the POS EDGE signals occurring within a preset time interval from the TC signal. For example, the stage can be obtained when two (2) POS EDGE signals each occur within plus or minus (1) clock period with respect to the baud rate counter 20. To accomplish this, the outputs of both of the phase detectors 16 and 40 also are fed via respective lines 52 and 54 to a clock synchronization detector 56. The positive phase detector 16 output is compared to the TC signal fed to the clock synchronization detector 56 from the baud rate counter 20 via the line 36 and a line 58.

When the two consecutive POS EDGE signals occur, the clock synchronization detector 56 determines the timing of the negative edge that occurs between the two POS EDGE signals with respect to the baud rate counter 20. The clock synchronization detector 56 latches this timing by generating a SEARCH signal on a line 60. The SEARCH signal selects either the POS EDGE signal or the NEG EDGE signal as the SAMPLE signal. The SAMPLE signal is fed to a virtual counter 62 via a line 64. The SAMPLE signal selects the proper time period from the virtual counter 62 to sample the data pulse, as will be described hereinafter.

The SEARCH signal is fed via the line 60 to both of the AND gates 32 and 46 and to the digital filter 28. The SEARCH signal at the input of the gates 32 and 46 locks out both the POS EDGE signal and NEG EDGE signal from reloading the respective baud rate counters 20 and 42. Thus, in the search stage, the baud rate counter's 20 and 42 only are loaded via respective TC signals. The SEARCH signal fed to the digital filter 28 allows the signal from the negative phase detector 40, which is fed to the digital filter 28 via a line 66, now to also correct for phase errors with respect to the NEG EDGE signal.

Now, if the incoming NEG EDGE signal occurs at the negative phase detector 40 early with respect to an input fed to the negative phase detector 40 from the baud rate counter 42 via a line 68, then the increment counter signal UP is fed to the preset counter 22 via the digital filter 28. In a like manner, if the NEG EDGE signal occurs late at the negative phase detector 40, then the decrement counter signal DOWN is fed to the preset counter.

The digital phase locked loop 10 will generate a CLOCK SYNC pulse on a line 70 from the clock synchronization detector 56, after a preset number of POS EDGE signals have occurred within a specified tolerance to indicate that the digital phase locked loop 10 is locked onto the incoming data pulse streams. The virtual counter 62 outputs a DATA CLOCK out signal on a line 72, which then is utilized to sample the data in the data pulse stream to recover the transmitted data (RECOVERED DATA) as illustrated in FIG. 2.

Figure 2:
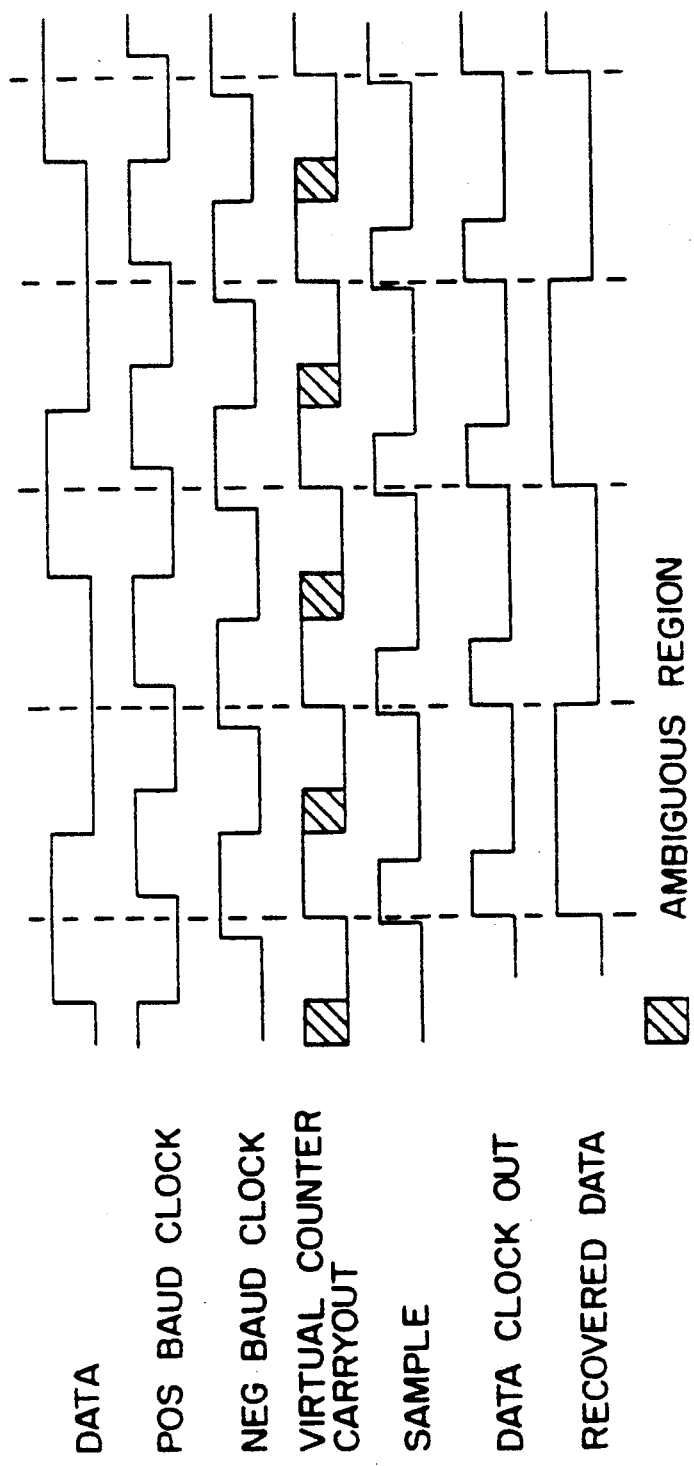
FIG. 2 is a waveform diagram of the asymmetrical data tracking digital phase locked loop of FIG. 1.

The waveforms in FIG. 2 are generally self explanatory with respect to the description above provided, with the exception of the CARRY OUT signal of the virtual counter 62. Referring again to FIG. 1, the virtual counter 62 includes an arithmatic logic unit (ALU) 74. The ALU 74 has a pair of input lines 76 and 78, one respectively from each of the baud rate counters 20 and 42.

The inputs on the lines 76 and 78 are the outputs of the baud rate counters 20 and 42, also fed to the positive phase detector 16 and the negative phase detector 40. These two counter outputs are combined in the virtual counter 62 to generate the DATA CLOCK edge located at the midpoint between the corresponding baud rate counter edges from the two baud rate counters 20 and 42. The outputs of the baud rate counters 20 and 42 are added together and divided by two in the ALU 74 at each local oscillator clock cycle. Since only the most significant bit (MSB) is needed for the data rate clock, the CARRY OUT signal can be utilized to implement the DATA CLOCK output via an AND gate 80.

Since as illustrated in FIG. 2, the CARRY OUT signal can include discontinuities (ambiguous regions), the SAMPLE signal is utilized to ensure that only one correct DATA CLOCK signal is generated for each data pulse. Thus, the CARRY OUT signal and the SAMPLE signal both must be input to the AND gate 80 to generate a valid signal. The signal is coupled to a flip-flop 82, which in turn generates the DATA CLOCK signal on the line 72.

The digital phase locked loop 10 is designed for the type of data pulse signal width which can vary between received signals, but does not vary significantly during a transmission. If the data pulse width changes after the clock synchronization, the digital phase locked loop 10 will hunt with alternating up and down corrections being made. This hunting can be alleviated by providing a second digital filter and a second preset counter to provide separate logic circuits for tracking the POS EDGE signal and NEG EDGE signals independently of one another.

In summary, the digital phase locked loop 10 is capable of locking onto data pulse widths which are significantly less than half of the baud period and permits the correct recovery of the transmitted data. The digital phase locked loop is stable in operation with few phase corrections over a time period, since the phase errors are determined with respect to the NEG EDGE signal and POS EDGE signals utilizing separate baud rate counters instead of the virtual counter 62.

The embodiments of the invention in which an exclusive property or privilege is claimed are defined as follows:

1. In a digital phase locked loop, the improvement comprising:
   edge detection means for generating a positive edge signal and a negative edge signal when a data pulse is input thereto;
   means for coupling said positive edge signal and negative edge signal to respective baud rate counters, each said baud rate counter generating an output signal; and
   each said baud rate counter output signal coupled to counting means for generating a data clock signal midway between said positive edge signal and negative edge signal.

2. The loop as defined in claim 1 wherein said counting means include virtual counting means for generating said data clock signal.

3. The loop as defined in claim 1 including initial pulse lock in means including phase detector means for generating a phase signal for at least one of said positive edge and said negative edge signal and means for correcting the count of said respective baud rate counters if said phase signal occurs early or late with respect to said baud rate counter output signal.

4. The loop as defined in claim 3 wherein said count correcting means include preset counter means for coupling a predetermined data rate into said baud rate counters and means for incrementing or decrementing said preset counter means in response to said phase signal.

5. The loop as defined in claim 4 including digital filter means for providing dampening to said count correcting means by eliminating continuous phase corrections.

6. The loop as defined in claim 4 including means for generating a search signal when a predetermined number of said phase signals occur within a preset tolerance of said baud rate counter output signal.

7. The loop as defined in claim 6 wherein said means for generating a search signal further includes means for generating a sample signal and coupling said sample signal to said counting means to generate said data clock signal.

8. The loop as defined in claim 6 including means for coupling said search signal to said baud rate counters to block the input of said positive edge and negative edge signals.

9. The loop as defined in claim 6 including phase detector means for generating a phase signal for each respective positive edge and negative edge signal and including means for incrementing or decrementing said preset counter means in response to each said phase signal following generation of said search signal.

10. A digital phase locked loop comprising:
edge detection means for generating a positive edge signal and a negative edge signal when a data pulse is input thereto;
means for coupling said positive edge signal and negative edge signals to respective baud rate counters, each said baud rate counter generating an output signal;
said baud rate counter output signals coupled to counting means for generating a data clock signal midway between said positive edge signal and negative edge signals; and
initial pulse lock in means including phase detector means for generating a phase signal for at least one of said positive edge and said negative edge signals and means for correcting the count of said respective baud rate counters when said phase signal occurs early or late with respect to said baud rate counter output signal, said count correcting means including preset counter means for coupling a predetermined data rate into said baud rate counters and means for incrementing or decrementing said preset counter means in response to said phase signal.

11. The loop as defined in claim 10 wherein said counting means include virtual counting means for generating said data clock signal.

12. The loop as defined in claim 10 including digital filter means for providing dampening to said count correcting means by eliminating continuous phase corrections.

13. The loop as defined in claim 10 including means for generating a search signal when a predetermined number of said phase signals occur within a preset tolerance of said baud rate counter output signal.

14. The loop as defined in claim 13 where in said means for generating a search signal further includes means for generating a sample signal and coupling said sample signal to said counting means to generate said data clock signal.

15. The loop as defined in claim 13 including means for coupling said search signal to said baud rate counters to block the input of said positive edge and negative edge signals.

16. The loop as defined in claim 13 including phase detector means for generating a phase signal for each respective positive edge and negative edge signal and including means f or incrementing or decrementing said preset counter means in response to each said phase signal following generation of said search signal.

* * * * *